United States Patent
Geiger et al.

(10) Patent No.: US 7,129,734 B2
(45) Date of Patent: Oct. 31, 2006

(54) METHOD FOR TESTING ANALOG AND MIXED-SIGNAL CIRCUITS USING FUNCTIONALLY RELATED EXCITATIONS AND FUNCTIONALLY RELATED MEASUREMENTS

(75) Inventors: Randall Geiger, Boone, IA (US); Kumar Parthasarathy, Dallas, TX (US); Degang Chen, Ames, IA (US); Le Jin, Ames, IA (US); Turker Kuyel, Austin, TX (US)

(73) Assignees: Iowa State University Research Foundation, Inc., Ames, IA (US); Texas Instruments, Inc., Dallas, TX (US)

( * ) Notice: Subject to any disclaimer, the term of this patent is extended or adjusted under 35 U.S.C. 154(b) by 23 days.

(21) Appl. No.: 10/850,854

(22) Filed: May 21, 2004

(65) Prior Publication Data

US 2005/0088164 A1  Apr. 28, 2005

Related U.S. Application Data

(60) Provisional application No. 60/473,182, filed on May 23, 2003.

(51) Int. Cl.
*G01R 31/26* (2006.01)
(52) U.S. Cl. ...................................... 324/765
(58) Field of Classification Search ............... None
See application file for complete search history.

(56) References Cited

U.S. PATENT DOCUMENTS 5,298,858 A * 3/1994 Harrison ................... 324/235
5,606,515 A * 2/1997 Mockapetris et al. ... 324/207.16
6,005,407 A * 12/1999 Arabi et al. ................ 324/765
2005/0057271 A1* 3/2005 Olleta et al. ................ 324/765

OTHER PUBLICATIONS

Jin et al., "A Blind Identification Algorithm for Digital Calibration of Pipelined ADC", IEEE Midwest Symposium on Circuits and Systems, Tulsa, Aug. 2002.
Jin et al., "A Blind Identification Approach to Digital Calibration of Analog to Digital Converts for Built-In-Self-Test", IEEE International Symposium on Circuits and Systems, May 2002.
Parthasarathy et al., "A Modified Histogram Approach for Accurate Self-Characterization of Analog-to-Digital Converters", Proc. 2002 IEEE International Symposium on Circuits and Systems, Arizona, May 2002.
Parthasarathy et al., "Accurate Self Characterization and Correction of A/D Converter Performance", 2001 IEEE Midwest Symposium on Circuits and Systems, Aug. 2001.
Parthasarathy K. L., et al., "A histogram based AM-BIST algorithm for adc characterization using imprecise stimulus", the 2002 45th Midwest Symposium on Circuits and Systems, Conference Proceedings, Tulsa OK, Aug. 4-7, 2002, Midwest Symposium on Circuits and Systems, New York, NY, vol. 1 of 3, Aug. 4, 2002, pp. 274-277, XP010635378.
Kuyel T., et al., "Optimal analog tri techniques for improving the linearity of pipeline ADCs", Proceedings International Test Conference 2000 (nt. Test Conference, Washington, DC, Oct. 3, 2000, pp. 367-375, XP002300186.

* cited by examiner

*Primary Examiner*—Jermele Hollington
(74) *Attorney, Agent, or Firm*—McKee, Voorhees & Sease, P.L.C.

(57) ABSTRACT

A method for testing a circuit includes determining at least one performance characteristic of the circuit based on a functional relationship between excitation signals or on a functional relationship between measurement devices. The method is implemented either as a part of a built-in self test circuit of an integrated circuit or for production testing.

26 Claims, 2 Drawing Sheets

METHOD FOR TESTING ANALOG AND MIXED-SIGNAL CIRCUITS USING FUNCTIONALLY RELATED EXCITATIONS AND FUNCTIONALLY RELATED MEASUREMENTS

PRIORITY STATEMENT

This application claims priority to U.S. Provisional Application No. 60/473,182, filed on May 23, 2003, herein incorporated by reference in its entirety.

GRANT REFERENCE

Work for this invention was funded in part by a grant from the National Science Foundation Grant No. 0120345. The Government may have certain rights in this invention.

BACKGROUND OF THE INVENTION

The present invention relates to the testing of analog and mixed-signal circuits. More particularly, although not exclusively, the present application relates to the testing of analog and/or mixed-signal circuits in both built in self test (BIST) and production environments.

The use of mixed-signal circuits continues to grow, as does their complexity. At the same time, there is a need for such devices to be of lower cost and to have decreased production time. One significant obstacle in trying to meet these constraints involves the resources required for testing. These resources can include the time it takes to test each device, the costs of testing and measurement equipment, and the availability of testing and measurement equipment. In addition, there is a problem in that the load of the tester may mask or alter the measurements of the device under test.

Therefore, it can be seen that problems with testing analog and/or mixed-signal circuits in both production test and BIST environments remains. Thus, it is a primary object of the invention to improve upon the state of the art.

A further object, feature, or advantage of the present invention is to provide for a method of testing that allows for the production of high performance mixed-signal integrated circuits using low cost components and subcircuits.

A still further object, feature, or advantage of the present invention is to provide for accurate and complete testing of high performance analog and mixed-signal circuits.

Another object, feature, or advantage of the present invention is to provide for accurate testing of analog and mixed-signal circuits suitable for application in a low cost production test environment.

Yet another object, feature, or advantage of the present invention is to provide for testing of analog and mixed-signal circuits suitable for use in built-in self test applications.

Yet another object, feature, or advantage of the present invention is to provide performance enhancement, yield enhancement and/or area reduction by using feedback from a BIST structure to adapt or calibrate the device under test (DUT).

These and/or other objects, features, and advantages of the present invention will become apparent from the subject matter disclosed herein.

SUMMARY OF THE INVENTION

According to one aspect of the invention, a method for testing analog and mixed-signal circuits is disclosed that does not require precise knowledge of the input and measurement system. Instead of requiring precise knowledge of the input and measurement system, functional relationships are exploited to determine performance characteristics of the circuits. Two or more functionally related excitations (FRE) serve as inputs to a device under test (DUT). Measurements are made with two or more functionally related measurement devices (FRM). From the observed outputs, the performance characteristics of interest of the DUT are determined by making appropriate calculations based upon, without limitation, information obtained from the outputs, knowledge about the relationships between the inputs and knowledge about the relationships between the measurements.

Where the circuit is a mixed-signal circuit with digital inputs, such as a digital-to-analog converter (DAC) then the two or more functionally related excitations are not used as the input signal is digital. Where the circuit is a mixed-signal circuit with digital outputs, such as an analog-to-digital converter (ADC), the two or more functionally related measurement devices are not used because the output is digital.

According to another aspect of the invention, an analog or mixed-signal circuit is provided having FRE and/or FRM structures for implementing a BIST. Because precise knowledge about the excitations and the measurement system is not needed, the die area for implementing the excitation and measurement systems can be made smaller with only modest performance requirements.

According to another aspect of the invention, a circuit having a BIST is used to evaluate and enhance the performance and/or yield of analog and mixed-signal circuits after fabrication. The performance of the chip is measured and a feedback loop is provided to adapt (tune) the circuit to meet target specifications.

According to another aspect of the invention, the FRE/FRM approach is used in the circuit design process for debugging designs and for designing new architectures with FRE/FRM capability in a feedback control loop for self adaptation.

According to another aspect of the present invention, a method is provided to prevent noise associated with one excitation or measurement from corrupting and/or interfering with other excitation(s) and/or measurement(s) in the FRE/FRM approach.

According to another aspect of the present invention, a method of arranging multiple excitations or measurements in time or location is provided to reduce the sensitivity of the test procedure to nonstationarity of the test environment.

DETAILED DESCRIPTION OF EXEMPLARY EMBODIMENTS

The present invention includes a method of testing analog and mixed-signal circuits in which precise knowledge of the input and measurement system is not needed. With this approach, two or more functionally related excitations (FRE) serve as inputs to a device under test (DUT). Measurements are made with two or more functionally related measurement devices (FRM). From the observed outputs, the performance characteristics of interest of the DUT are determined by making appropriate calculations based upon, without limitation, information obtained from the outputs, knowledge about the relationships between the inputs, knowledge about the relationships between the measurements and information about the characteristics of the excitations and measurement systems. The FRE/FRM approach is applicable to either production test or built in self-test (BIST) implementations. Since precise knowledge about the excitations and the measurement system are not needed, the cost and complexity of the excitation and measurement systems can be reduced in a production test environment and the die area for implementing the excitation and measurements system can be made small with modest performance requirements in BIST environments. In a BIST implementation, the FRE/FRM approach can be used to evaluate and enhance the performance of analog and mixed-signal circuits after fabrication. In a design process, the FRE/FRM approach can be used for debugging designs and for designing new architectures with FRE/FRM capability in a feedback control loop for self adaptation.

Figure 1:
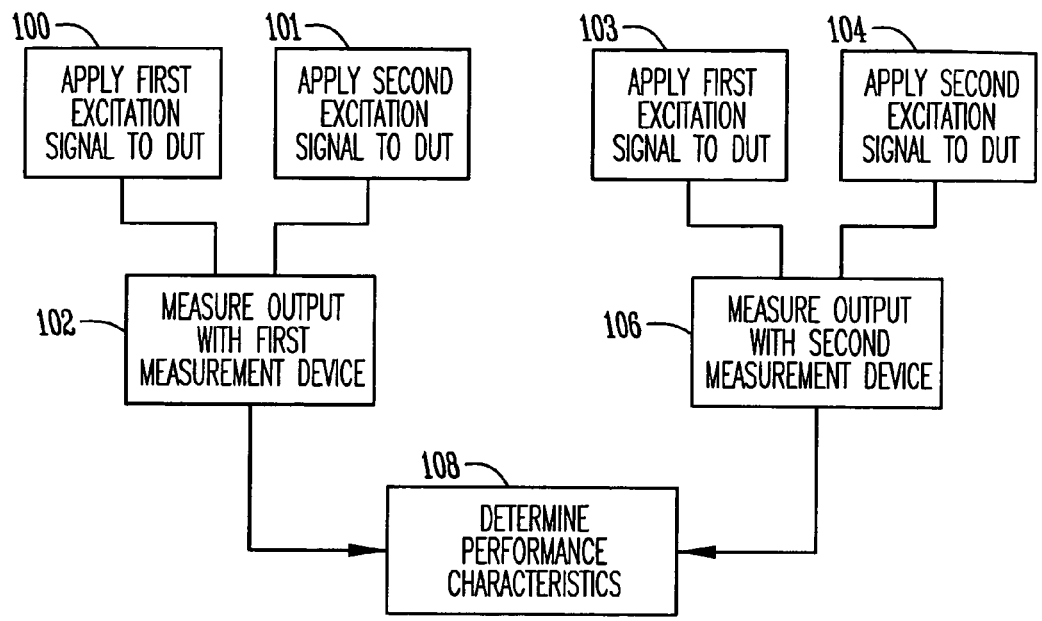
FIG. 1 provides an overview of one embodiment of the methodology of the present invention.

FIG. 1 provides an overview of the methodology according to one embodiment of the present invention. In FIG. 1, a first excitation signal is applied to a DUT in step 100 and a second excitation signal is applied to a DUT in step 101. The present invention contemplates that the DUT is an integrated circuit or a portion of an integrated circuit. In steps 102 and 103, the outputs of the DUT from steps 100 and 101 are measured with the first measurement device. In steps 106 and 107, the outputs of the DUT from steps 104 and 105 are measured with the second measurement device. In step 108, performance characteristics of the DUT are determined at least partially based on one or more relationships between the excitation signals and/or one or more relationships between the measured outputs. Because the relationships are used, the precision associated with the excitation signals and/or measurement devices is of less importance.

Figure 2:
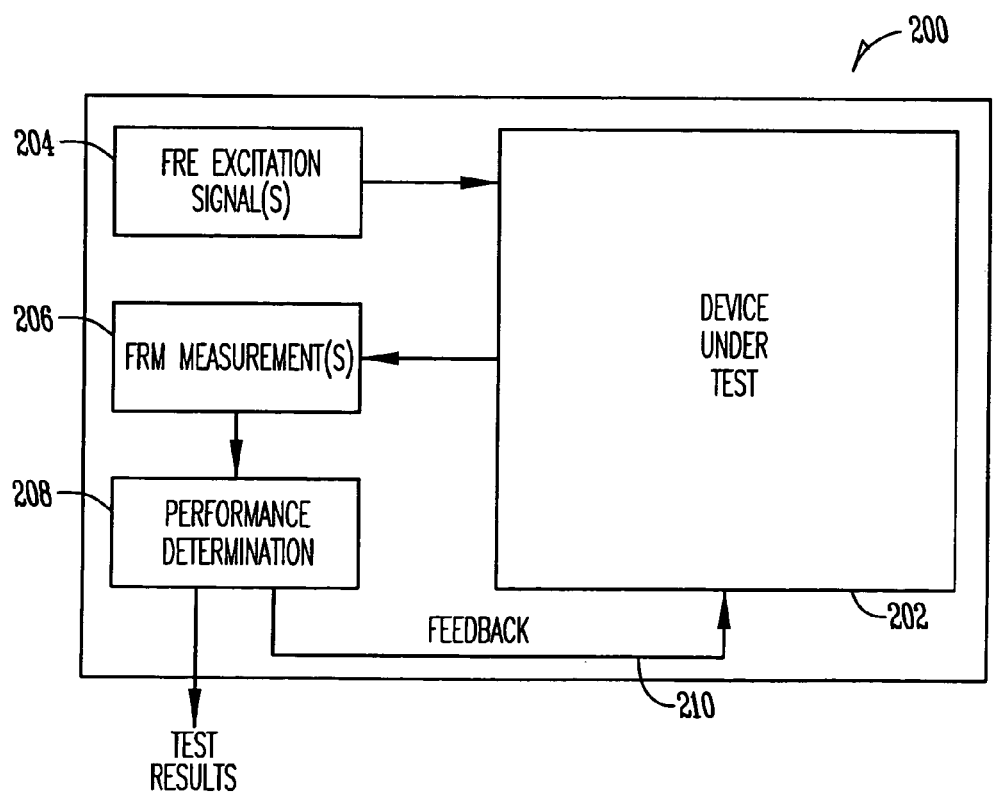
FIG. 2 provides a block diagram of one embodiment of an integrated circuit having BIST.

FIG. 2 illustrates a block diagram of one embodiment of the present invention where an integrated circuit is adapted with FRE/FRM used for built-in self test. In FIG. 2, an integrated circuit 200 is shown. The integrated circuit includes a portion or subcircuit 202 that is to be tested. A FRE signal(s) portion 204 of the integrated circuit 200 is used to generate one or more excitation signals that are applied to the under test portion 202 of the integrated circuit 200. A FRM measurement portion 206 of the circuit is operatively connected to the under test portion 202 of the integrated circuit 200 for measuring the effect of an excitation signal generated by excitation signal(s) portion 204 on the under test portion 202. The measurement portion 206 can include one or more measurement devices. The performance determination portion 208 uses the relationships between excitation signals and/or relationships between measurement devices to determine information related to the performance characteristics of the device under test portion 202. The present invention allows for the information determined by the performance determination portion 208 to be output via a feedback connection 210 to the portion of the device under test 202 to adjust or tune the circuit. The test results can also be output to the device periphery. The FRE and/or FRM structures allow for performance determination without the need for precise knowledge about the excitations and the measurement system. Because precise knowledge about the excitations and the measurement system is not needed, the die area for implementing the excitation and measurement systems can be made small with only modest performance requirements.

Special cases of this approach are systems where the output is inherently digital in which case no measurement system is needed or where the input is inherently digital in which case no analog excitation is required. Analog to Digital Converters (ADCs) are an example of systems where the output is inherently digital and Digital to Analog Converters (DACs) are an example of a system where the input is inherently digital. Other special cases of this approach include those where precise inputs are available and functionally related measurements are made or where precise measurement systems are available and functionally related excitations are used.

In one embodiment of the present invention, the methodology of the present invention is used to test ADCs. This approach can be appropriately termed testing of ADCs with FRE. With the FRE approach to testing ADCs, two or more excitations are applied to the input of the ADC under test (DUT) and the corresponding outputs are observed. From the observed outputs, the performance characteristics of interest of the ADC are inferred by making appropriate calculations based upon information obtained from the outputs and knowledge about the relationships between the inputs. These calculations are based upon a mathematical formulation of the FRE test procedure and the sequence of calculations are termed FRE algorithms. In contrast to most existing approaches to testing of ADCs which depend upon making calculations based upon the observed output and precise knowledge of the input waveform or waveforms, the FRE approach does not require precisely knowing the input waveform or waveforms. The inherent advantage of this approach is that very imprecise excitations which can be readily and inexpensively generated can be used for ADC testing. The FRE approach offers potential for reducing the cost of production testing if FRE algorithms that provide good correlation between inferred ADC performance and actual ADC performance are used and if the costs of implementing these algorithms are sufficiently low. The FRE approach also offers potential for partially or fully built in self test (BIST) in which some or all of the FRE excitations and some or all of the FRE algorithms are implemented on a chip or in a system. With the FRE approach, the relationship between the excitations may be precisely known, or the relationship between the excitations may be only approximately known, or the relationship between the excitations may have a known form but with unknown parameters. Many different excitations can be used to implement the FRE and for a given pair or set of excitations, many different FRE algorithms can be used to infer how the DUT is performing.

According to one embodiment of the present invention, Slope Error Compensated Histogram (SECH) methods are used as the FRE algorithms. According to a second embodiment, Stimulus Error Identification and Removal (SEIR) methods are used as the FRE algorithms. Examples showing both types of algorithms are provided. In the SECH methods, an estimated slope of a nonlinear input signal function is required as a part of a histogram method and the error in this estimate is corrected if need be. The type of slope estimation selected can also be used to reduce errors.

In the SEIR methods, potential sources of error, such as the effect of additive noise, the effect of quantization error in transition time, the effect of the shift between two signals and others, or other sources of error are identified and analyzed so the proper adjustments can be made to reduce or remove error.

Figure 3:
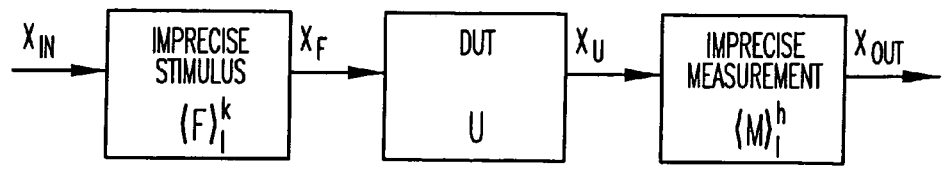
FIG. 3 is a block diagram illustrating one embodiment of imprecise stimuli and/or imprecise measurement provides for measurement of characteristics of a device under test according to one embodiment of the present invention.

1. Example for ADC Testing with Low Accuracy Stimuli Using a Slope Error Compensated Histogram (SECH) Method In this embodiment a method of testing ADCs is described that uses a SECH methodology for ADC testing with low accuracy stimuli and imprecise measurements. Familiarity with traditional ADC linearity testing is assumed. This embodiment illustrates the use of both FRE and FRM. A method and system for testing is shown in FIG. 3. In contrast to the standard test flow where a precise input stimulus is used and a precise measurement is taken, this alternative method and system for testing uses multiple imprecise excitations and correspondingly has multiple imprecise measurements.

As shown in FIG. 3, it is assumed that there are k imprecise stimuli presented to the DUT and there are h imprecise measurements. If all h imprecise measurements are made for each imprecise excitation, a set of input and output test vectors are obtained for each stimulus-measurement combination. Mathematically, the resultant family of test vectors can be expressed as $$X_{OUT(i,j)}=M_i(U(F_j(X_{IN(i,j)})))+N(X_{IN(i,j)}) \text{ for } 1\leq i \leq h, 1 \leq j \leq k \quad (1)$$

The immediate question that needs to be addressed is whether sufficient information exists in the resultant family of test vectors to uniquely determine U. The answer to this question depends strongly on the nature of the sequences of stimulus and measurement functions. According to this embodiment, sufficient information does exist for testing ADCs with one class of imprecise stimuli. There are many other classes of stimulus and measurement functions that will provide sufficient information to uniquely determine U as well. The present invention is in no way limited to the particular classes of stimulus and measurement functions described herein. Preferably, however, the classes of stimulus and measurement functions are selected such that a manageable number of measurements arithmetic manipulations are used.

This embodiment shows how imprecise stimuli can be used to test ADCs. A detailed mathematical explanation is provided. The performance of this embodiment is supported by computer simulations and measured results obtained from a production test environment. The ADC example shows that both the number of measurements and the number of arithmetic manipulations needed are manageable. The present invention is in no way limited to this particular embodiment as the present invention contemplates other approaches of characterization of analog or mixed signal circuits. Instead of generating a very precise ramp signal, the ADC is characterized with multiple imprecise inputs. In particular, two input signals $V_{IN}^1$ and $V_{IN}^2$ that can be imprecise are used. The two signals can be highly nonlinear; the algorithm exploits the relationship between the two signals while estimating the INL and DNL of an ADC without being affected by input-introduced errors.

Consider the testing of an ADC with imprecise stimulus signals. In this exemplary algorithm, two nonlinear ramp signals are used, with the second being a constant-shifted version of the first. The input signal is assumed to be a strictly increasing function of time and the speed at which the signal increase does not change dramatically. Furthermore, we assume that the signal generator is short-time stationary, meaning that if the same signal is regenerated within a short time period, the regenerated signal should be very close to the original signal, with the maximum difference much smaller than 1 LSB. Except for these reasonable and easy-to-satisfy conditions, the stimulus signals are allowed to be imprecise. The signal could have a significant error from what it is supposed to be, an ideal ramp in this case. Furthermore, the error is unknown to the design engineers or test engineers. It is uncertain in the sense that it is process and environment dependent. This significantly relaxes the requirement on the signal generator so that it can be easily implemented with low cost or on chip.

Figure 4:
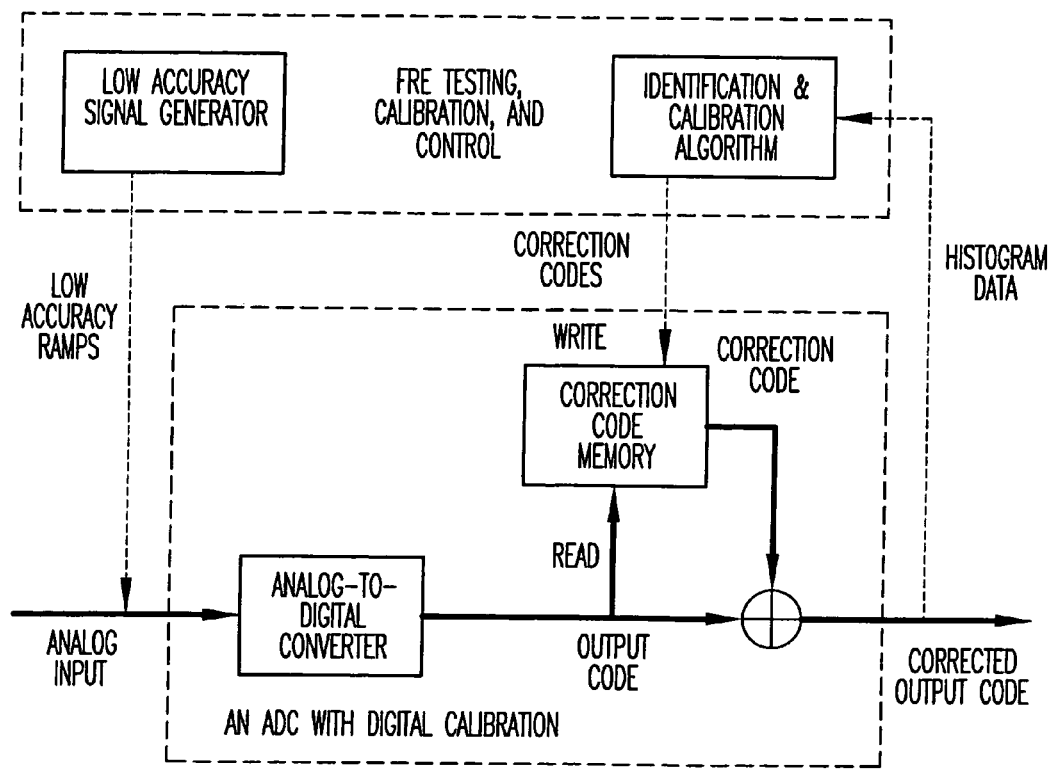
FIG. 4 illustrates one embodiment of an ADC with digital calibration according to one embodiment of the present invention.

FIG. 4 is used to illustrate the basic idea of the algorithm used in this embodiment of the present invention. The vertical axis is marked with the actual and the end-point fit-line transition points of the ADC, respectively. The two nonlinear curves represent the two ramp-like signals. Mathematically, the two nonlinear signals can be described by $$V_{IN}^1 = f(t) \quad (2)$$

$$V_{IN}^2 = f(t) - \alpha \quad (3)$$

where $\alpha$ is the constant shift between the two signals. The tallies of codes obtained when $V_{IN}^1$ and $V_{IN}^2$ are presented as the ADC input signals are $C_k^1$ and $C_k^2$, respectively. The amount of shift between the two signals is unknown and not measurable externally and need to be estimated as an additional variable. Assuming the signals are sampled uniformly with a sampling period $T_{SAMP}$, the time index when the value of the signal $V_{IN}^1(V_{IN}^2)$ crosses transition level $T_k$ (indicating that the value of the input signal equals the value of the particular transition voltage of the ADC), measured in units of sampling period $T_{SAMP}$, is $\Sigma C_k^1 (\Sigma C_k^2)$. And this relationship is subject to time quantization errors. That is $$T_k = I_k + \Psi_k \cong f\left(\sum_{i=0}^{k} C_i^1\right), k=0, 1, 2, \ldots, N-2 \quad (4)$$

$$T_k = I_k + \Psi_k \cong f\left(\sum_{i=0}^{k} C_i^2\right) - \alpha, k=0, 1, 2, \ldots, N-2 \quad (5)$$

To simplify the analysis, we will consider the system to be noiseless. The effects of noise and errors will be discussed later. Subtracting the $(k-1)^{th}$ equation in (5) from the $k^{th}$ equation in (4) yields:

$$1 + \Psi_k - \Psi_{k-1} = f\left(\sum_{i=0}^{k} C_i^1\right) - f\left(\sum_{i=0}^{k} C_i^2\right) + \alpha, \quad (6)$$

$$k=1, 2, \ldots, N-2$$

Expressions in the equation above are given in LSB. The 1 in front of the equation means 1 LSB. On the left hand side of (6) is the code width $T_k - T_{k-1}$ corresponding to code $D_k$. On the right hand side is the code width expressed as a function of the summation of tallies. The difference between the first two terms on the right hand side of (6) can be written as $$f\left(\sum_{i=0}^{k} C_i^1\right) - f\left(\sum_{i=0}^{k} C_i^2\right) = f'(\xi_k)\left(\sum_{i=0}^{k} C_i^1 - \sum_{i=0}^{k-1} C_i^2\right), \quad (7)$$
$$k = 0, 1, 2, \ldots, N-2$$

where $f'(\xi_k)$ is an unknown variable, because the exact function form of the input signal is unknown. Though we use the notation of derivative in the expression, its physical meaning is simply the slope of a section of the nonlinear function $f(t)$ between $f(t)=T_k$ and $f(t)=T_{k-1}+\alpha$.

There are different ways to approximate the slope and the present invention contemplates that where slope approximation is used, any of a numbers of different ways can be used. In one embodiment, a simple approximation for slope is provided by averaging the slopes of $V_{IN}^1$ and $V_{IN}^2$ over the interval between $T_{k-1}$ and $T_k$ as shown in equation (8):

$$f(\xi_k) \cong \frac{1}{2}\left(\frac{1 + \Psi_k - \Psi_{k-1}}{C_k^1} + \frac{1 + \Psi_k - \Psi_{k-1}}{C_k^2}\right), \quad (8)$$
$$k = 1, 2, \ldots, N-2$$

If the nonlinearity in the input has a form of a second order polynomial, the approximation in equation (8) is actually exact. The effects of the slope approximation will be further discussed later. Substituting (7) and (8) into equation (6) and rearranging lead us to $$1 = \frac{\alpha}{1 - \gamma_k} + \Psi_{k-1} - \Psi_k, \quad k = 1, 2, \ldots, N-2 \quad (9)$$

where $$\gamma_k = \frac{1}{2}\left(\frac{1}{C_k^1} + \frac{1}{C_k^2}\right)\left(\sum_{i=0}^{k} C_i^1 - \sum_{i=0}^{k-1} C_i^2\right).$$

Equation (9) is a set of linear equations with respect to unknown variables $\alpha$ and $\Psi_k$, k=1,2, . . . , N−3. Many standard mathematical methods can solve this type of equation set. Some of them have a computational complexity proportional to $(N-2)^3$. For high resolution ADCs, N is very large and these methods will take a prohibitively long time to get the results. We propose a method with a computational complexity only proportional to N−2. Notice that by adding all equations in (9), the $-\Psi_k$ term of one equation will cancel the $\Psi_k$ term of the next equation and we have $$N - 2 = \alpha \sum_{i=1}^{N-2} \frac{1}{1 - \gamma_i} + \Psi_0 - \Psi_{N-2}.$$

Using the fact $\Psi_0=\Psi_{N-2}=0$, we get an estimation of the shift between the two stimuli $$\alpha_{est} = \frac{(N-2)}{\sum_{i=1}^{N-2} \frac{1}{1 - \gamma_i}} \quad (10)$$

Substituting the value of $\alpha$ into equation (9), we can estimate the integral nonlinearity of the ADC as $$\Psi_{k,est} = \left(\sum_{i=1}^{k} \frac{1}{1 - \gamma_i}\right) \alpha_{est} - k, \quad k = 1, 2, \ldots, N-3 \quad (11)$$

Based on the estimated value of integral nonlinearity, we can calculate the differential nonlinearity of the ADC as $$\Delta_{k,est} = \frac{\alpha}{1 - \gamma_k} - 1, \quad k = 1, 2, \ldots, N-2 \quad (12)$$

From the integral nonlinearity and the differential nonlinearity, both the INL and DNL parameters are calculated as:

$$INL_{est} = \max_k\{|\Psi_{k,est}|\} \text{ and } DNL_{est} = \max_k\{|\Delta_{k,est}|\}. \quad (13)$$

1.1 The ADC Identification Algorithm Using Low Accuracy Stimuli

The method discussed above can be summarized as an algorithm with the following steps.

1. Use a signal $V_{IN}^1$ to excite the ADC under test and collect the histogram $\{C_k^1, k=0,1,\ldots,N-1\}$ 2. Regenerate the signal $V_{IN}^1$ but shift it down by a constant voltage $\alpha$ to obtain $V_{IN}^2$.

3. Use the signal $V_{IN}^2$ to excite the ADC under test and collect the histogram $\{C_k^2, k=0,1,\ldots,N-1\}$ 4. Calculate $$\gamma_k = \frac{1}{2}\left(\frac{1}{C_k^1} + \frac{1}{C_k^2}\right)\left(\sum_{i=0}^{k} C_i^1 - \sum_{i=0}^{k-1} C_i^2\right), k = 1, 2, \ldots N-2.$$

5. Calculate $$\alpha_{est} = \frac{(N-2)}{\sum_{i=1}^{N-2} \frac{1}{1 - \gamma_i}}.$$

6. Calculate $$\Psi_{k,est} = \left(\sum_{i=1}^{k} \frac{1}{1-\gamma_i}\right) \alpha_{est} - k, k = 1, 2, \ldots, N-3.$$

7. Calculate $$\Delta_{k,est} = \frac{\alpha}{1-\gamma_k} - 1, k = 1, 2, \ldots, N-2$$

8.

$$INL_{est} = \max_k \{|\Psi_{k,est}|\} \text{ and } DNL_{est} = \max_k \{|\Delta_{k,est}|\}.$$

The input signals can be generated very fast. It is not necessary to wait until the stimulus settles because they are not required to be linear. So test time of an ADC can be dramatically reduced. The histogram data collection in step 1 and 3 is the same as that for the traditional ADC linearity test. The voltage shift in step 2 is simply an analog addition and can be realized in hardware. Steps 4, 5 and 6 can be done by either a computer or through on-chip DSP functionality. The performance of these steps does not add significant processing time to test.

1.2 Performance Analysis

This embodiment of an algorithm has the capability to test an ADC using low accuracy input signals and estimate the integral and differential nonlinearities of the ADC to higher accuracy than that of the stimuli, which is inherently not doable for the traditional histogram method. Therefore, this algorithm of the present invention has wider applications for low cost production test and mixed signal BIST, where high accuracy input signals are too expensive to build or too challenging to design.

Comparison of algorithm with traditional histogram method

The traditional histogram method will directly transform the nonlinear error in input signals into the error in estimation of integral and differential nonlinearities. To estimate the INL and DNL of an ADC to accuracy of 0.1 LSB, the input signal must be a decade more linear than the ADC so that the input nonlinearity is less than 0.1 LSB. This is the common knowledge that to test an n-bit ADC, the input signal should be more than (n+3)-bit linear. Furthermore, because of noise errors, even with an (n+3)-bit linear input, accuracy of 0.1 LSB is usually not achievable. Including the noise effect, a reasonable error bound for ADC production test in the industry is half LSB. This embodiment of an algorithm of the present invention can eliminate the effect of the huge input nonlinearity and estimate the INL to an error less than 0.8 LSB as further discussed herein. This embodiment of an algorithm of the present invention can do the INL and DNL test for an n-bit ADC by using only (n−7)-bit linear signals and has the performance comparable to that of the traditional histogram method which requires (n+3)-bit linear input signals.

1.2.1 Effects of Slope Approximation

Two major factors contribute to the error in the proposed algorithm. The first is the error of associated with the slope approximation using the average in equation (8). The second is the error in $C_k^1$ and $C_k^2$. We will talk about each of them as follows.

In the algorithm used in this embodiment of the present invention, we were required to estimate the slope of the nonlinear input function over the interval between $\Sigma C_k^1$ and $\Sigma C_k^2$. This slope strongly depends on the nature of the unknown nonlinear input signal function. There are many ways to do the estimation and without the knowledge of the input, no one method can be said to be more accurate than the other. Therefore we use the average of slopes at two end-points of the interval, $\Sigma C_k^1$ and $\Sigma C_k^2$, to approximate the required slope factor in equation (8). Although not very precise, this approximation gives us a simple calculation towards INL estimation. If the nonlinear function representing the input is a second order polynomial, then the above estimate gives the exact value of the slope. Let's assume that the input is of the general form given by $$f(t) = at^2 + bt \quad (14)$$

The slope of the input signal over the interval between $t_1$ and $t_2$ is given by $$\frac{f(t_2) - f(t_1)}{t_2 t_1} = a(t_2 + t_1) + b \quad (15)$$

On the other hand, if we derivatives $t_1$ and $t_2$ and obtain their average, we will have $$\frac{f'(t_2) - f'(t_1)}{2} = \frac{2at_2 + b + 2at_1 + b}{2} = a(t_2 + t_1) + b \quad (16)$$

We can see that the slope and the average are exactly the same. This corroborates the fact that if the nonlinear input is mainly in the shape of a second order polynomial, our slope approximation will not introduce major errors in INL and DNL parameter estimation.

In reality, the input can have various shapes different from a second order polynomial. But our slope approximation is still accurate under most of the situations, such as that the slope of the nonlinear function changes slowly, or that the length of the interval is small, i.e., a small shift between two signals, etc. The effectiveness of the simple average slope approximation will be verified by both simulation and experimental results in the next section.

1.2.2 Error in Histogram Measurement

The histogram data, $C_k^1$ and $Ck_k^2$, are mainly affected by the additive noise at the input of the ADC. Let us assume that the additive noise is stationary with mean 0 and variance $\sigma^2$. The noise may result in a different output code than the expected value and larger variance makes the code more likely to be different from its expected value. For instance, if we consider the accumulated histogram, $\Sigma C_k^1$, which is the number of codes less than or equal to code k. In the traditional histogram method, this number is the estimated value of the $k^{th}$ transition point except for a constant scaling factor. In the proposed algorithm also, this number gives the first order approximation of the $k^{th}$ transition point. But any error in this number will translate into an error in the integral nonlinearity estimation and finally into an error in INL and DNL estimation. However, since there are many samples for each code, an addition or subtraction of one or two samples will not have a significant effect on the total number of samples for a code. Intuitively, the variance of $\Sigma C_k^1$ may increase as the variance of the additive noise increases. With detailed statistic analysis, we can show that the following relationship is true.

$$\sigma_N^2\left\{\sum C_k^1\right\} = B_1 \frac{\sigma}{N_s} \quad (17)$$

where $N_S$ is the average sample density. The subscript N signifies that the variance of $\Sigma C_k^1$ is due to additive noise. Equation (17) states that the variance of the accumulated histogram is proportional to the standard deviation of the additive noise, where $B_1$ is a coefficient dependent on the distribution of the noise. When the noise becomes large, the uncertainty in the accumulated histogram data will also increase, but at a speed slower than that of the noise. This implies that the error in INL and DNL estimation will not increase as fast as the noise. The time domain quantization errors have effects on the accumulated histogram and the final INL and DNL estimation. The quantization effect is closely related to the average number of samples per code. With more samples, the quantization error will be small and the accumulated histogram can accurately characterize the transition points. Since the quantization error is distributed between 0 and $1/N_S$, we have $$\sigma_Q^2\left\{\sum C_k^1\right\} = \frac{B_2}{N_S^2} \quad (18)$$

The subscript Q signifies that this part is due to the time domain quantization effect. $B_2$ is a coefficient dependent on the distribution of the quantization error. From the expression above we can see that increasing the number of samples can significantly reduce the quantization error in accumulated histogram and give out better estimation for INL and DNL. The total estimation error will be due to the combined effect of the quantization errors and additive noise.

1.3 Simulation and Experimental Results

Simulations and experiments are done to verify the performance of the proposed algorithm. Simulation results show that the algorithm can estimate the integral and differential nonlinearities for a 12-bit ADC to 12-bit accuracy by using input signals of only 7-bit linearity and the performance of the algorithm is in agreement to theoretical analyses. In experiments, the integral and differential nonlinearities of 10-bit ADCs are estimated to more than 9-bit accuracy by using 2-bit linear signals.

1.3.1 Simulation Results

Simulations were run under different combinations of parameters such as noise variance, the resolution of ADCs, the number of samples per code, etc. The nonlinear input signal used in the simulation is given by $$f(t) = t + 0.04 \times (t^2 - t) - 0.02 \times (t^3 - 1.5t^2 + 0.5t) \quad (19)$$

It has second order and higher order polynomial nonlinear terms with linearity less than 7 bits. Although in reality we can easily generate much better input signals a highly nonlinear input was used in our simulations to confirm the rigidity of the algorithm. Simulation results were obtained for a 12-bit ADC. The average number of samples per bin was chosen to be 32 ($N_S=32$) and $\sigma=0.8$ in simulation. It was observed that the actual integral nonlinearity of the ADC is between +6 and -4 LSB. Stimulation confirmed the nonlinearity of the device as predicted using the proposed algorithm with a 7-bit linear input signal. The difference between the actual nonlinearity values and estimated nonlinearity values is between +1 and -0.8 LSB. It can be observed that using the newly proposed algorithm, a 12-bit device can be characterized to within +/-1 LSB with an input signal which is just 7-bit accurate. The traditional algorithm identifies the device to have 45 LSB INL. This magnitude of error is observed because the conventional histogram approach assumes that the input is a highly linear ramp, and any nonlinearity in input is wrongly interpreted as errors in the ADC. The proposed algorithm is not affected by this nonlinearity in the input. The performance of the proposed algorithm under different noise and samples/bin were also simulated on a 10-bit ADC. The results are summarized in Table 1. The actual integral nonlinearity of the software modeled 10-bit ADC is between +3 and -2 LSB. The proposed algorithm was then used to identify the device and for each combination of noise and samples/bin, the algorithm was run 32 times to compute the variance.

TABLE 1

Variance of the error in INL estimation vs. σ and $N_s$

|  | $N_s$ | | |
| --- | --- | --- | --- |
| σ | $N_s = 16$ | $N_s = 32$ | $N_s = 64$ |
| σ = 0.2 | 0.2458 | 0.0773 | 0.0324 |
| σ = 0.4 | 0.7265 | 0.2036 | 0.0804 |
| σ = 0.8 | 1.5633 | 0.4806 | 0.1813 |
| σ = 1.6 | 2.4974 | 0.9912 | 0.3505 |

From the result we can see that the error in INL estimation is affected by both the noise effects and quantization effects as discussed in section IV. By choosing appropriate sample density, we can estimate the INL of an ADC to a reasonable accuracy, e.g., less than 0.5 LSB, even under large noise variance.

1.3.2. Experimental Results

Simulation shows that the proposed algorithm can test INL and DNL for high resolution, 12-bit or above, ADCs to accuracy that is better than 1 LSB. In experiment, 10-bit commercial pipelined ADCs were tested to prove the effectiveness of the algorithm. Though test for 10-bit ADCs is a known art, an input of 13 bit or higher linearity is always required. We are going to show the test result for a 10-bit ADC by using signals that are less than 3-bit linear. If the traditional method was used, it would be very unlikely to accurately identify the INL and DNL of a 10-bit ADC by using a 3-bit linear signal. There. might be errors of hundreds of LSBs. By using the proposed algorithm we will see that the INL and DNL of 10-bit ADCs can be estimated to accuracy of better than 0.3 LSB in experiment. This result is as good as the result for a traditional histogram method by using a 13-bit signal.

A commercially available ADC was tested to estimate the effectiveness of the algorithm. Different ADCs and raw data were obtained. The entire testing was performed in a production test environment. As a first attempt, a commercial tester used in production testing was used to generate the input signals and collect the output histograms. The tester was programmed to generate input signals with only 2–3 bit linearity (much more nonlinear than what was used in software simulations reported above). Although signals of much better linearity can be generated on-chip, to confirm the robustness of the algorithm and to consider the case of high resolution ADCs (14 bit and above) where 8–9 bit linear input signals are limiting factor, the input signals used in the test runs were intentionally limited to a low linearity. The second signal was obtained by subtracting a DC shift value of about 10 LSB from the first signal. This amount of shift and the exact nature of the input signal were unknown to the algorithm. These values were independently computed as part of the algorithm. Results of INL estimation using the proposed algorithm with the above described highly nonlinear input signals were then compared to the results calculated from using the traditional histogram algorithm with a highly linear ramp signal. The signals were sampled at 32 samples per code on average.

To start with, the results using the highly linear signal and the traditional histogram method were considered to be the true nonlinearity of the ADC. The difference between the results using the proposed algorithm and the traditional method is then the residual error of the new algorithm. The algorithm is able to identify the nonlinearity of the device to within 0.7 LSB using an input signals that is just 2 bit linear. The experiments were then repeated on 20 different ADCs. The same input signal with nearly 2 bit linearity was used to test all the devices. The amount by which the second nonlinear signal was shifted with respect to the first was nearly 10 LSB for all devices.

The parts can be identified to accuracy of 1 LSB using the new algorithm. Further, to see the effect of noise, one part was randomly picked again, and a highly linear ramp and traditional histogram test was performed on the same device twice; and the INL predicted using the two linear ramp data were compared. Ideally we would expect the INL prediction to be same, since they represent the same device. But a maximum error of 0.7 LSB was found between the two runs.

Thus even with a highly linear ramp and the traditional test approach, we get a marginal difference between repeated runs on the same device, indicating that noise in measurement is a major limiting factor in the identification of the device performance, and places a lower bound on the estimation accuracy. Given this effect of noise in measurement, due to factors like temperature and time related drift, the above errors in estimation using the proposed algorithm is very reasonable.

1.4 Conclusions Regarding SECH Embodiment

This embodiment illustrates one example of a new invention for analog and mixed-signal circuit test Unlike traditional approaches that require precise, linear and stationary input stimuli and measurement, the methodology of the present invention can work with imprecise and nonlinear stimuli and measurements. To identify the performance of a DUT, post-processing of data acquired from imprecise stimuli and measurements is required. This methodology includes an algorithm for ADC linearity test using nonlinear stimuli. As described in this embodiment, the ADC's INL and DNL parameters can be accurately estimated by using input signals with much lower linearity. Simulation and experimental results show that this algorithm can identify the INL of 10-bit or high resolution ADCs to sub LSB accuracy by using stimuli of less than 7-bit linearity, only 2 bit linearity in the experiment. This methodology can be used for built-in self-test and low cost production test.

2. Stimulus Error Identification and Removal (SEIR) Method

This embodiment of the present invention is demonstrated in the context of an ADC linearity test. The present invention is not limited to this embodiment, and contemplates numerous methods for using FRE and/or FRM. For purposes of this example, knowledge of conventional methodology of testing ADC linearity is assumed.

In conventional methodology, the input nonlinearity is calculated in a manner that includes nonlinearities from different sources coupled to each other which cannot be identified at the same time. In the algorithm of this embodiment of the present invention, two analog input signals will be used, and the nonlinearity in the input and INL of an ADC will be separated first and then identified. The second signal is simply a shifted replica of the first input signal with a shift voltage $\alpha$. Such a shift could easily be obtained in hardware by an analog summing circuit.

$$x_1(t) = T_0 + (T_{N-2} - T_0)t + F(t) \tag{20}$$

$$x_2(t) = T_0 + (T_{N-2} - T_0)t + F(t) - \alpha \tag{21}$$

Transition time for the two signals is defined by following equations $$T_i = x_1(t_i^{(1)}) \tag{22}$$

$$T_i = x_2(t_i^{(2)}) \tag{23}$$

Equations 22 and 23 are key to understand the logic behind our new method. Any non-linear (or linear) input maps the transition points of the ADC onto the time axis represented by histogram counts. The same ADC transition points can be mapped onto time axis with different histogram counts, using a different input.

Notice that this allows the ADC nonlinearity to be left at one side of the equation. If $\{C_i^{(1)}, i=0,1, \ldots, N-1\}$ and $\{C_i^{(2)}, i=0,1, \ldots, N-1\}$ are histogram data collected by using $x_1$ and $x_2$, respectively, estimates of transition time can be expressed in following equation. Therefore, the non-uniform sampling pattern on the normalized time axis (corresponding to ADC transitions projected through each non-linear input) is given by:

$$\hat{t}_i^{(1)} = \frac{\sum_{k=0}^{i} C_k^{(1)} - C_0^{(1)}}{\sum_{k=0}^{N-2} C_k^{(1)} - C_0^{(1)}} \tag{24}$$

$$\hat{t}_i^{(2)} = \frac{\sum_{k=0}^{i} C_k^{(2)} - C_0^{(1)}}{\sum_{k=0}^{N-2} C_k^{(1)} - C_0^{(1)}} \tag{25}$$

where time is shifted and scaled with respect to the first signal, with origin at $C_0^{(1)}$ and unit time at $C_{N-2}^{(1)}$. We can now have the estimate of INL formulated using each input signal and corresponding histogram counts.

$$I\hat{N}L_i^{(1)} = (N-2)\hat{t}_i^{(1)} + \sum_{j=1}^{M} a_j F_j(\hat{t}_i^{(1)}) - i, \; i = 1, 2, \ldots N-3 \tag{26}$$

-continued $$I\hat{N}L_i^{(2)} = (N-2)\hat{t}_i^{(2)} + \sum_{j=1}^{M} a_j F_j(\hat{t}_i^{(2)}) - \alpha - i, \quad (27)$$

$$i = 1, 2, \ldots N-3, \quad \hat{t}_i^{(2)} \le 1$$

Notice that instead of the nonlinearity only being parameterized on the interval [0, 1,] as in the traditional method, in (25) some transition time of the second input will be larger than 1. For that part of transition time, parameters are not well defined by the traditional method, so those corresponding equations are excluded from (27). Roughly speaking the last α (in LSB) equations in (27) will have transition time larger than 1, so the total number of equations will be N−3−α. We will see for a reasonable shift value this reduction in number of equations will not affect the performance of the new method and discuss it effects later.

Equations (26) and (27) constitute the body of our method. The left hand side of the equations (ADC's trip points) will cancel when two equations are subtracted from each other and the input nonlinearity will be left alone in a parameterized form. Moreover, there will be more equations than parameters, so the system can be solved using a standard parameter estimation method. Regardless of the difference between two estimates of a same INL, we still have N+M−3 unknowns, N−3 INL and M $a_j$ parameters. But this time we have two input signals and a nearly doubled number of 2(N−3)−α equations with small shift. This makes the identification of the unknowns possible. Equating the right hand side of (26) and (27), we have $$(N-2)\hat{t}_i^{(1)} + \sum_{j=1}^{M} a_j F_j(\hat{t}_i^{(1)}) = (N-2)\hat{t}_i^{(2)} + \sum_{j=1}^{M} a_j F_j(\hat{t}_i^{(2)}) - \alpha \quad (28)$$

We can see that there is only the nonlinearity in the input signal and no INL of the ADC in the equation above. Move the linear terms of transition time to one side and nonlinear and shift terms to the other side, we have $$(N-2)(\hat{t}_i^{(2)} - \hat{t}_i^{(1)}) = +\sum_{j=1}^{M} a_j (F_j(\hat{t}_i^{(1)}) - F_j(\hat{t}_i^{(2)})) + \alpha, \quad (29)$$

$$i = 1, 2, \ldots, N-3, \quad \hat{t}_i^{(2)} \le 1$$

There are roughly N−3−α linear equations for M unknown parameters $a_j$. If the number of codes is much larger than the number of basis functions and the shift, parameters are over constrained by (29) and can be estimated by using the least mean squares (LMS) method. The LMS method has a beneficial property that if there is any noise or errors in equation (29), their effects will be partially or totally averaged out by the LMS method. Naming estimated values of the parameters to be $\hat{a}_j$, j=1,2, . . . , M and substituting them into either equation (26) or (27) or their combination, we can estimate INL of the ADC. Using (26) for example, we will have $$I\hat{N}L_i = (N-2)\hat{t}_i^{(1)} + \sum_{j=1}^{M} \hat{a}_j F_j(\hat{t}_i^{(1)}) - i, \quad i = 1, 2, \ldots N-3 \quad (30)$$

2.1 Error Analysis

There are several sources of errors that will affect the performance of the algorithm. Among them the additive noise in the signal, the non-parameterized error of the signal, and the quantization error of transition time as in equation may have the most significant effects on the INL test results obtained by our method. Using the first signal as an example, with noise and errors the relationship between transition points and the estimated transition time can be written as $$T_i = \quad (31)$$

$$T_o + (T_{N-2} - T_0)\hat{t}_i^{(1)} + \sum_{j=1}^{M} a_j F_j(\hat{t}_i^{(1)}) + e(\hat{t}_i^{(1)}) + n(\hat{t}_i^{(1)}) + d(\hat{t}_i^{(1)} - t_i^{(1)})$$

where $e(\hat{t}_i^{(1)})$ is the non-parameterized error, $n(\hat{t}_i^{(1)})$ is the effect of the additive noise, and $d(\hat{t}_i^{(1)} - t_i^{(1)})$ is the quantization error. We further assume the noise and errors will not affect the LMS estimation of $\hat{a}_j$, j=1,2, . . . , M so that they can viewed the same as $\hat{a}_j$, j=1,2, . . . , M. This is a fair assumption based on the following reasons. First, the non-parameterized error is orthogonal to the first M sinusoidal functions by definition. Second, the additive noise and quantization error are usually changing very fast as a function of time so that they have little components correlated to low frequency basis functions. Third, the LMS method will also average out the effect of fast changing components in noise and errors. Therefore the difference between the INL calculated in equation (30) and the actual INL is $$INL_i - I\hat{N}L_i = e(\hat{t}_i^{(1)}) + n(\hat{t}_i^{(1)}) + d(\hat{t}_i^{(1)} - t_i^{(1)}) \quad (32)$$

Each of these terms is discussed separately.

2.1.1 Effects of the Non-Parameterized Error in Input Signals

The magnitude of $e(\hat{t}_i^{(1)})$ is dependent on the number of basis functions used in parameterization, M, and on the nonlinearity of the input signal itself. As mentioned earlier, $e(\hat{t}_i^{(1)})$ can be reduced to arbitrarily small by increasing M. In reality, we can require the input signal to be stationary and changing slowly. The nonlinearity in the input can be large, but it doesn't change too fast so that we can parameterize it with reasonable number of basis functions to get a small residue error. Higher spatial-frequency nonlinearities can be handled by increasing the number of basis functions.

2.1.2 Effects of the Non-Parameterized Error in Input Signals

Assume the additive noise at the input to an ADC is stationary and Gaussian with variance $\sigma^2$. The noise may make the output code different from its expected value so that bin counts are affected by it. Larger variance of the noise makes the code more likely to be different from its expectation. However, there are many samples for each code. Change of one or two samples' value will not have a significant effect on the total number of samples for a code. Intuitively, the variance $n(\hat{t}_i^{(1)})$ may be proportional to the variance of the additive noise and inversely proportionally to the average number of samples per code. With more detailed statistic analysis, we can show that the following general relationship is true.

$$\sigma\{n(\hat{t}_i^{(1)})\} = \sqrt{A\frac{\sigma}{N_s}} \ (LSB) \tag{33}$$

where $N_s$ is the average number of samples per code. A is a constant dependent on the distribution of the noise. For Gaussian noise, A=0.5642. This sensitivity to noise is also a fundamental problem in conventional histogram based ADC test algorithm.

2.1.3 Effects of the Quantization Error in Transition Time

The quantization error of transition time is bounded. A smaller clock period $T_c$ will produce more samples in total and a larger average number of samples per code $N_s$. So the quantization error will become smaller. The standard deviation of the quantization error can be expressed in terms of $N_s$ as $$\sigma\{d(\hat{t}_i^{(1)} - t_i^{(1)})\} = \sqrt{\frac{1}{12N_s^2}} \ (LSB) \tag{34}$$

In equation (34) we assume the quantization error is uniformly distributed. Typically, in an all codes production testing environment, $N_s$ is between 20 to 100 samples per code. The magnitude of the additive noise determines which term of (33) and (34) is more important to the test result. If the standard deviation of the additive noise is comparable to 1 LSB, the quantization error is much smaller than the effect of the noise.

For high resolution ADCs, up to 1 LSB rms noise is typical. That is why we state earlier that the quantization effect of transition time can be neglected. The same quantization error is also an issue in traditional histogram based testing.

2.1.4 Effects of the Shift Between Two Signals and Others

The value of voltage shift á between two input signals also affects the final INL estimation results. If the shift is too small, the difference between the nonlinearity of the two input signals at the same code level will be very small and noise in equation (31) will have significant effects on the LMS method. The assumption that estimated parameters $â_j$, j=1,2, . . . , M are close to the actual value doesn't hold any more and the numerical behavior of the LMS method is no longer reliable under that situation. The shift can not be too large as well. As mentioned before, the last α equations in (29) will not be used to estimate the parameters, so the LMS result is only optimal for part of the input nonlinearity and not necessary to be optimal for the nonlinearity on the whole interval of [0, 1]. Analysis shows that 0.1 to 1% shift is appropriate for the proposed method. Both simulation and experimental results support this conclusion. The method estimates the amount of shift, so, no prior knowledge on the amount of shift is assumed.

We assume the two input signals are identical but with a constant shift. This is not true in reality. We always have time varying effects in the test, e.g. the drift of reference voltage. The signal source may change from the first to second run, which will introduce gain error and different nonlinearity between two signals. These non-stationary effects can be eliminated by well designed time interleaving measurement. Two signals are interleaved in time to excite the ADC and collect histogram data. By using "common-centroid" sequence to interchange between the two signals, most of the non-stationary effects are cancelled in experiment.

2.1.5 Simulation Results

Simulation has been done in Matlab, using different combinations of ADC resolution, the average number of samples per code, the nonlinearity of the input, the additive noise, and the voltage shift between two input signals. Simulation results show that the algorithm can accurately identify INL of an ADC of different resolution by using nonlinear excitations under various situations. Results for testing a 14-bit simulated ADC under different noise level and average number of samples are summarized as follows. The first nonlinear input signal is modeled as $$x_1(t) = (N-2)[t + 0.004 * (t^2 - t)] + noise \tag{35}$$

The maximum nonlinearity specified in (35) is 0.1% of the total input range. The shift between the first and second signals is assumed to be unknown but chosen to be 128 LSBs. 11 sinusoidal basis functions are used in parameterization of the nonlinear term in the input. If the additive noise has a standard deviation of 0.8 LSB and 16 samples are taken for each code on average, the error in INL estimation is less than 1 LSB.

Other results for different combination of the average number of samples per code and noise are summarized in Table 2 for the same ADC.

TABLE 2

Error in INL estimation for different $N_s$ and $\sigma$
Shift = 128 LSB, 11 sinusoidal basis functions

| $N_s$ | Σ (LSB) | INL error (LSB) | $N_s$ | σ (LSB) | INL error (LSB) |
|---|---|---|---|---|---|
| 16 | 0.8 | 0.78 | 16 | 0.2 | 0.46 |
| 32 | 0.8 | 0.54 | 16 | 0.4 | 0.60 |
| 64 | 0.8 | 0.40 | 16 | 0.8 | 0.78 |
| 128 | 0.8 | 0.32 | 16 | 1.6 | 1.22 |

For each of the INL error data in Table 2, four tests are simulated for each set of the same $N_s$ and, and an average value of error are calculated and listed. This allows us to statistically analyze the performance of the proposed algorithm. From Table 2, we can see that if $N_s$ is increased by 4 times, the error in INL estimation is reduced by about 50%; if the standard deviation of the additive noise is increased by 4 times, the error in INL estimation is increased by 2 times. This is totally in agreement with equation (33).

2.2 Test Results From a 16-Bit SAR ADC

A real 16-bit ADC is also tested to verify the performance of the new method. This laser trimmed 16-bit ADC is a known test challenge due to excellent linearity performance (typically +−1.5 LSBs). The test hardware used for the verification of our method is the same hardware used in the production testing of the device.

2.2.1 Test Setup

Verification of the full performance of this ADC requires extreme attention to test hardware design. A 12-layer handler interface board is used with extensive ground, supply and reference coverage. Extreme care is given to reduce ground loops and also to obtain proper bypassing. High performance contactors, high precision resistors, high performance capacitors and precision op-amps are used throughout the board. Latching relays are used to reduce temperature gradients generating metal to metal contact noise effects. The digital outputs are damped and buffered properly to avoid current surges. The test platform is Teradyne A580 Advanced Mixed Signal tester. The source generating both the linear and the synthetic nonlinear excitations is a 20-bit multi-bit delta-sigma DAC with 2 ppm typical linearity error, 100 uV/minute typical drift characteristics, and 2 KHz bandwidth (this source is a typical example demonstrating that an expensive signal generator is not always good enough to provide low drift, high speed and good linearity all at the same time). DC shift of the nonlinear excitation is given through an analog summing circuit. In the experiment, the testing of histogram data using nonlinear signals and identification of INL using the proposed method are done in different platforms. The tester setup, including the shape of the nonlinearity in the input and shift between two signals are not known to the identification algorithm at all. Only two sets of histogram bin counts are fed into the analysis program.

2.2.2 Test Data Collection and Analysis

The INL of the ADC was first obtained by using the histogram from an ideal ramp excitation. This method is the traditional method used during the production testing of the ADC. The INL of the ADC measured with nonlinear input and calculated with the traditional histogram method. In the traditional method, any input nonlinearity appears as ADC nonlinearity. The nonlinearity is simply one period of a sine wave with some slight phase shift. These two nonlinear signals have only 8-bit linearity. They are fairly linear for the real world, but for our 16-bit, precision ADC, the amount of non-linearity at the input is simply excessive. Needless to say, these inputs are synthetically generated to be a representative of real world quasi-linear analog ramp generators such as simple integrators. When this the method of this embodiment is applied to the measured bin count data, we get an estimate of the INL which closely follows the traditional method of an ideal ramp excitation. This difference is promising and can be acceptable as far as 16 bit converters are concerned. Up to 0.5 LSB variation (3 sigma) is inherent in histogram testing with 32 samples per code.

In the methodology of this embodiment, there is no reliance on the selection of the form of basis functions. INL measured with linear and nonlinear signals are in agreement with each other with an absolute difference less than 1.2 LSBs across all 65536 codes. This difference may be due to noise effect or due to the drift error in input signals. The methodology of this embodiment accurately identifies the INL of an ADC using a very low accuracy input signal with 300+LSB (~8-bit) nonlinearity. The test time penalty of this algorithm is insignificant. The actual test time for this 16-bit ADC is 25 seconds, and the post-processing of the algorithm takes 1.2 seconds in Matlab to calculate the INL from the collected bin counts. Once coded in the tester workstation, the algorithm is expected to complete well within 100 milliseconds. If a fast nonlinear source were used, the test time would actually improve.

2.2.2 Conclusions Regarding SEIR Embodiment

This embodiment solves the mathematics behind linearity testing of ADCs using non-linear signals. A nonlinear stationary excitation and its shifted replica are needed for a complete mathematical solution. No assumptions on the shape or the frequency of the nonlinearity are made. No prior knowledge about the shift or nonlinearity is required. Using actual production test hardware, the method was shown to test a high performance 16-bit ADC to well within its +−2 LSB comparison specifications, using only 8-bit linear inputs. The algorithm has insignificant negative impact to test time. With the introduction of this method and similar future methods, the test hardware development paradigm could easily shift from linear source development, to low drift and high-speed source development. The nonlinear low-drift input waveform and its shifted replica can even be generated on chip as a built in self-test feature. The algorithm directly applies to DAC testing as well, since it cancels the ADC nonlinearity totally while estimating the source (DAC) nonlinearity.

3. Improving AMS Circuits Using FRE/FRM Methodology of the Present Invention

The present invention also provides for other examples of wide-reaching applications for the FRE/FRM methods of the invention. In this embodiment of the present invention, a structure for analog-to-digital converters with digital calibration is disclosed. In this embodiment the calibration is implemented as a foreground calibration. However, one skilled in the art will recognize that it can be modified to be done in the background. An ADC of this structure has two modes in working, the identification and calibration mode and the conversion mode. In the identification and calibration mode, the transfer characteristic of the ADC is tested using FRE/FRM methods and correction codes are generated. In the conversion mode, a raw output of the ADC is calibrated by adding up an associated correction code to generate the final output. Thus the ADC performance can be improved. The block diagram of the approach is plotted in FIG. 4. The dotted lines represent information flows during the identification and calibration mode. They can be referred to as the test path. The solid lines represent information flows during the data conversion mode. The can be referred to as the signal path.

The box on top in the dashed line is an algorithm for AMS circuits' identification and calibration using FRE/FRM methods. At the present stage, this algorithm is implemented off chip with an external signal generator and a computer to do calculation. For built-in self-test applications, this block will be integrated on the silicon using DSP capability already available on chip. The low requirement on the signal generator and reasonable computational complexity of the algorithm make the integration practical. The box at the bottom in the dashed line is a simple model for an ADC with digital calibration capability. During identification and calibration mode, correction codes are determined and written into the correction code generator. When the ADC is converting an analog voltage into a digital code, the raw output will be used to read a correction code from the generator. There are many ways to realize this code generator, e.g. a ROM lookup table or a programmable logic. It is currently implemented as a software lookup table as a proof of concept.

3.1 AMS Circuits Characterization Using FRE/FRM Methods

Traditionally, ADC linearity test requires a stimulus signal at least one decade more accurate than the ADC. The proposed approach relaxes this requirement. It identifies and removes the effects of input non-linearity using FRE/FRM methods, so that signals that are decades less accurate than the ADC can be used as stimuli in testing, while characteristics of the ADC can be estimated accurately.

3.2 Digital Calibration Using Circuits Characteristics

A correction code, $C_k$, can be determined for each output code "k" of an ADC using estimated $INL_k$, $$\hat{C}_k = \text{round}((I\hat{N}L_k + I\hat{N}L_{k-1}+1)/2), \ k=1\ldots,N-2 \quad (36)$$

The final output will be calibrated as $$D_k = k + C_k, \ k=0,1\ldots,N-2 \quad (37)$$

Equation (37) calibrates each output code "k" of an ADC with a correction code. Every bit of the output is used. We call it an all-bit calibration approach. This approach gives an optimal correction code to each output "k" for digital calibration. But the correction code generator will become very complex to implement as the resolution of the ADC increases. A compromise of these two factors is to do p-bit calibration, where p is less than the number of bits in an ADC output. Output codes with the same first p most significant bits are grouped together and calibrated by one correction code, $C_j$. By using estimated values of $INL_k$, this correction code can be calculated as $$\hat{C}_j = \text{round}\left[\frac{1}{q}\sum_{k=jq}^{(j+1)q-1}\left(I\hat{N}L_k + I\hat{N}L_{k-1}+1\right)/2\right], \quad (38)$$

$$j = 0, 1\ldots, 2^p - 1$$

where $q = N/2^p$ is the number of outputs in a group with the same first p bits. The final output will be calibrated as $$D_k = k + C_{j(k)}, k=0,1\ldots,N-2 \quad (39)$$

The relationship between the output "k" and the group index "j" is $$j(k) = \text{floor}(k/q), k=0,1\ldots,N-1 \quad (40)$$

3.3 Performance Evaluation for the Calibration Embodiment

Two calibration approaches discussed in the previous section are applied to the simulated 14-b pipelined ADC to test their performance. The 14-b ADC are implemented with 15 stages and has 15 bit raw output. Identification and calibration are done at the 15 bit level, and correction codes are generated for and added to the 15 bit raw output. Only the final output after calibration is presented in the 14 bit form, with the least significant bit truncated. So the calibration code has half a LSB resolution at the 14 bit level, which is 1 LSB at 15 bit level.

The original ADC without calibration has 11 bit linearity, with an INL of about 3 LSB. After calibration, its linearity is improved to 13 bit, with an INL of about 0.8 LSB. The INL after calibration can not be better than the original DNL+0.25 LSB, about 0.9 LSB in this example. The result of the all-bit calibration is in agreement with this theorem and achieves the lower bound.

Results of 8-bit calibration for the simulated 14-b ADC were also obtained. In this example 256 correction codes are used to calibrate 16384 outputs of the ADC. The ADC linearity after calibration is improved to more than 12 bit, with an INL of about 1.3 LSB. This performance after calibration is a little bit worse than that of the all-bit calibration, but its INL is still very close to the theoretical lower bound. Furthermore, the correction code generator circuit can be dramatically simplified because of the smaller number of bits used in calibration.

One skilled in the art having the benefit of this disclosure will appreciate that the FRE/FRM methods of the present invention can be used in a number of different types of applications, including in circuits used to provide digital calibration in AMS circuits.

4. DAC Characterization/Testing Approaching the FRM Method

Another embodiment of the present invention the FRM method is described in the specific context of characterizing or testing a DAC. To demonstrate benefits of the FRM method in accurate characterization for analog and mixed-signal devices using highly imprecise measurement systems, let us look at an example of DAC testing. No input non-linearity will be considered in this case, because DAC input signals are digital codes that are assumed to have no error. To measure DAC's analog output signal, a highly imprecise ADC with a sufficient number of quantization levels will be used. The ADC's largest code width should be small enough so that errors of the DUT at a ½ LSB level can cause a noticeable change in the ADC output. Other than this requirement, the ADC can be very inaccurate. In this demonstration, the FRM method consists of two measurements of DUT's output, where the second is obtained by applying a simple level shift to the output signal. More measurements and different functional relationships can be used in different applications.

4.1 DAC Testing Using the FRM Method

In the first measurement, the DAC (DUT) input code is gradually ramped up from zero to the full code. The ADC synchronously samples DUT's analog output signal and tallies the converted digital codes into a histogram $\{C_k^{(1)}, k=0,1\ldots,N_a-2\}$, where $N_a$ is the total number of ADC output codes. The histogram data can be interpreted to yield:

$$T_k = t_k^{(1)} + INL_{d_k}^{(1)} \quad (41)$$

where $T_k$ is the $k^{th}$ transition point of the ADC, $t_k^{(1)}$ is the corresponding transition time calculated as $$t_k^{(1)} = \frac{\sum_{i=0}^{k} C_i^{(1)} - C_0^{(1)}}{\sum_{i=0}^{N_a-2} C_i^{(1)} - C_0^{(1)}} \quad (42)$$

$d_k^{(1)}$ is the input code to the DUT at this transition time, and $INL_{d_k}^{(1)}$ is DAC's integral non-linearity of the code. The test is repeated during the second measurement. The only modification is that DUT's output signal is level shifted by $\alpha$ before fed to the ADC input. In a similar way, the second histogram $\{C_k^{(2)}, k=0,1\ldots,N_a-2\}$ produces another set of equations:

$$T_k = t_k^{(2)} + INL_{d_k}^{(2)} + \alpha \quad (43)$$

The two sets of equations can be combined to generate a single set of equations that involves DUT non-linearity only:

$$INL_{d_k}^{(1)} - INL_{d_k}^{(2)} - \alpha = t_k^{(2)} - t_k^{(1)} \quad (44)$$

If the ADC has more output levels than DAC's input codes, we have more equations in (44) than the number of $INL_d$ to be identified. Any robust parameter identification algorithms, such as the least squares method, can be employed to estimate the DAC's $INL_d$'s.

4.2 Performance of the DAC Testing Using the FRM Method

The following describes simulation results using the FRM method to accurately test a DAC. The DAC under test has a resolution of 11 bit, but only 7 bit linear with an INL of 4.3 $LSB_{11\text{-}b}$. The measurement system is an imprecise 12-b ADC. It is only 6 bit linear with an INL of more than 20 $LSB_{12\text{-}b}$. The simulated testing environment is set up so that the code density is equal to 64 samples per DAC code, the additive noise has a standard deviation of 0.25 $LSB_{11\text{-}b}$, and the level shift for the second measurement is about 16 $LSB_{11\text{-}b}$, which is unknown to the tester program.

The maximum estimation error in $INL_d$ is about 0.6 LSB, so the testing accuracy for the 11-b DAC is nearly 11 bit. For comparison, the performance of DAC testing using the same measurement system but without the FRM method was also determined. The error in $INL_d$ estimation is about 10 LSB, so the testing result is only 6-7 bit accurate. The FRM method offers significant improvement in testing accuracy, better than 4-bit in this example and potentially even more for higher resolution devices.

Therefore, a novel method and device for testing analog and mixed-signal circuits using functionally related excitations and functionally related measurements has been disclosed. The present invention, however, is not limited to these specific embodiments. The present invention contemplates variations in the type of mixed-signal circuits, the algorithms used to functionally relate excitation signals, the algorithms used to functionally related measurements, and the combinations of functionally related excitations signals, and functionally related measurements that are used. The present invention is not limited to the particular characteristics being tested, as one skilled in the art having the benefit of this disclosure will appreciate that any number of characteristics can be tested according to the methodology disclosed herein. The present invention is not to be limited to the specific embodiments described herein, but only by what is claimed.

What is claimed is:

1. A method for testing a circuit comprising:
   applying a first excitation signal to the circuit;
   applying a second excitation signal to the circuit, the second excitation signal having a first functional relationship with the first excitation signal;
   measuring outputs from the circuit wit first and second excitations with a first measurement device;
   measuring output from the circuit with first and second excitations with a second measurement device, the first measurement device having a second functional relationship with the second measurement device;
   determining at least one performance characteristic of the circuit at least partially based on the first functional relationship and the second functional relationship and the measurement results from the first measurement device and the second measurement device.

2. The method of claim 1 where more than two functionally related excitation signals are used.

3. The method of claim 1 where more than two functionally related measurement devices are used.

4. The method of claim 1 wherein the circuit comprises at least a portion of an ADC device.

5. The method of claim 1 wherein the circuit comprises at least a portion of a DAC device.

6. The method of claim 1 wherein the first functional relationship is defined by a nonlinear signal function having a slope.

7. The method of claim 6 wherein the step of determining includes determining an estimate of the slope of the nonlinear signal function.

8. The method of claim 7 wherein the step of determining further includes correcting the estimate of the slope.

9. The method of claim 1 wherein the step of determining includes correcting for at least one source of error.

10. A method for testing a mixed signal circuit comprising:
    applying a first analog excitation signal to the circuit;
    applying a second analog excitation signal to the circuit, the second excitation analog signal having a functional relationship with the first analog excitation signal;
    monitoring digital output signals from the circuit associated with applying the first analog excitation signal and the second analog excitation signal;
    determining at least one performance characteristic of the circuit based on the functional relationship and the digital output signals.

11. The method of claim 10 wherein the mixed signal circuit is an analog-to-digital converter.

12. The method of claim 11 wherein the first functional relationship is defined by a nonlinear signal function having a slope.

13. The method of claim 11 wherein the at least one performance characteristic includes an integral non-linearity characteristic.

14. The method of claim 11 wherein the at least one performance characteristic is associated with the conversion mode of the analog-to-digital converter.

15. The method of claim 11 wherein the at least one performance characteristic is associated with the identification and calibration mode of the analog-to-digital converter.

16. The method of claim 15 wherein the at least one performance characteristic includes a transfer characteristic.

17. The method of claim 16 further comprising wherein correction codes are generated during the step of determining.

18. The method of claim 17 further comprising calibrating output of the analog-to-digital converter by adding one of the correction codes.

19. A method for testing a mixed signal circuit comprising:
    applying digital input signals to the circuit;
    measuring analog outputs from the circuit associated with applying the digtal input signals with a first measurement device;
    measuring analog outputs from the circuit associated with arriving the digtal input signals with a second measurement device, the first measurement device having a second functional relationship with the second measurement device;
    determining at least one performance characteristic of the circuit at least partialLy based on the functional relationship and the measurement results.

20. The method of claim 19 wherein the mixed signal circuit is a digital to analog converter.

21. The method of claim 19 wherein the method is a built-in self-test method.

22. An integrated circuit, comprising:
    an integrated circuit portion under test;
    an integrated circuit excitation signal portion for providing at least one pxcitatioft signal to the portion under test;

an integrated circuit measurement portion for providing at least one measuremtrlt of at least one output from the portion under test;

an integrated circuit performance characteristic determination portion for determining at least one performance characteristic of the portion under test at least partially based on the at least one excitation signal and the at least one measurement and at least one functional relationship.

23. The integrated circuit of claim 22 wherein the functional relationship is an input excitation signal function relating a plurality of excitation signals.

24. The integrated circuit of claim 23 wherein the excitation signal function is nonlinear.

25. The integrated circuit of claim 22 wherein the functional relationship relates a plurality of the at least one measurements.

26. The integrated circuit of claim 22 wherein the performance characteristic portion is operatively connected to the portion under test to provide feedback to the portion under test.

* * * * *

UNITED STATES PATENT AND TRADEMARK OFFICE
CERTIFICATE OF CORRECTION

| | |
|---|---|
| PATENT NO. | : 7,129,734 B2 |
| APPLICATION NO. | : 10/850854 |
| DATED | : October 31, 2006 |
| INVENTOR(S) | : Randall Geiger et al. |

It is certified that error appears in the above-identified patent and that said Letters Patent is hereby corrected as shown below:

Claim 1, Column 23, line 46:
DELETE:
after circuit "wit"
ADD:
after circuit --with--

Claim 19, Column 24, line 51:
DELETE:
"arriving the digtal"
ADD:
--applying the digital--

Claim 19, Column 24, line 56:
DELETE:
after least "partialLy"
ADD:
after least --partially--

Claim 22, Column 24, line 66:
DELETE:
after one "pxcitatioft"
ADD:
after one --excitation--

UNITED STATES PATENT AND TRADEMARK OFFICE
CERTIFICATE OF CORRECTION

PATENT NO. : 7,129,734 B2
APPLICATION NO. : 10/850854
DATED : October 31, 2006
INVENTOR(S) : Randall Geiger et al.

It is certified that error appears in the above-identified patent and that said Letters Patent is hereby corrected as shown below:

Claim 22, Column 25, line 2:
DELETE:
after one "measuremtrit"
ADD:
after one --measurement--

Signed and Sealed this

Second Day of January, 2007

JON W. DUDAS
*Director of the United States Patent and Trademark Office*